United States Patent
Crawley

(10) Patent No.: US 7,218,179 B2
(45) Date of Patent: May 15, 2007

(54) METHODS AND APPARATUS FOR CALIBRATING GM-Z

(75) Inventor: Philip Crawley, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 87 days.

(21) Appl. No.: 10/854,980

(22) Filed: May 27, 2004

(65) Prior Publication Data

US 2005/0275477 A1 Dec. 15, 2005

(51) Int. Cl.
*H03K 3/03* (2006.01)
(52) U.S. Cl. .................. 331/57; 331/44; 455/318; 455/255; 455/256; 455/150.1; 455/192.1
(58) Field of Classification Search ........... 331/57, 331/44; 455/318, 255, 256, 150.1, 192.1; 375/219
See application file for complete search history.

(56) References Cited

U.S. PATENT DOCUMENTS

| | | | | |
|---|---|---|---|---|
| 5,612,648 A | | 3/1997 | McClellan et al. ......... 330/253 |
| 5,850,595 A | * | 12/1998 | Rieger et al. ............... 455/317 |
| 5,995,819 A | * | 11/1999 | Yamaji et al. .............. 455/326 |
| 6,111,467 A | | 8/2000 | Luo ........................... 330/305 |
| 6,118,811 A | * | 9/2000 | Narumi et al. .............. 375/219 |
| 6,150,884 A | | 11/2000 | Fattaruso .................... 330/257 |
| 6,198,356 B1 | * | 3/2001 | Visocchi et al. .............. 331/34 |
| 6,388,510 B2 | | 5/2002 | Hayashi et al. ............. 327/552 |
| 2005/0275477 A1 | * | 12/2005 | Crawley ....................... 331/57 |

* cited by examiner

Primary Examiner—Michael B. Shingleton
(74) Attorney, Agent, or Firm—Trop, Pruner & Hu, P.C.

(57) ABSTRACT

In one embodiment of the present invention, an apparatus includes a plurality of gain stages each having a gain greater than one, and which are coupled to create a positive feedback at an oscillation frequency. The gain stages may be formed of transconductance gain stages which may be coupled together as a ring oscillator or a latch type circuit. Such circuits may be used as calibration circuits in which small signal parameters of the gain stages are directly calibrated, and are used in turn to directly calibrate small signal parameters of a target circuit.

25 Claims, 5 Drawing Sheets

METHODS AND APPARATUS FOR CALIBRATING GM-Z

FIELD OF THE INVENTION

The present invention relates to calibration of a control circuit, and more particularly to calibration of a circuit having a transconductance and impedance (gm-Z).

BACKGROUND

Numerous circuits used in radio (high) frequency (RF) electrical devices, such as low noise amplifiers (LNAs), mixers, synthesizers, resistance capacitance (RC) filters and transconductance capacitance (gm-C) filters, require calibration. Specifically, calibration of open loop gain for such circuits is needed, because of the inability at high frequencies to use feedback techniques that normally work in conjunction with readily available matched passive components to set the gain. Gain is thus usually set by matching active transistor components to passive elements such as inductors, resistors and capacitors. Active components on an integrated circuit (IC) do not typically match very well to the passive components. As a result, a method of calibrating the gain to ensure that a design is manufacturable is needed.

Accordingly, separate control circuitry, namely calibration circuitry, is used to provide calibration of the gain of these RF components. Such calibration circuits typically include circuitry similar to or matched to that within the target circuit so that the target circuit may be calibrated for power supply variations, temperature variations, integrated circuit process parameter variations, parasitic capacitance, transconductance and the like. Such calibration circuits typically use the large signal characteristics of the devices in the target circuit. However, such calibration circuits can suffer from inaccuracies due to poor matching of large signal parameters to the small signal parameters, and it is the small signal parameters that determine the gain of the devices. As process geometries get finer, the large signal models for the devices no longer match simple textbook models for the transistors. This makes the task of building these circuits harder. As a result, a method for directly measuring and calibrating the small-signal parameters of transistors is increasingly necessary.

SUMMARY OF THE INVENTION

In certain embodiments, the present invention may include a plurality of gain stages each having a gain greater than one, and which are coupled to create a positive feedback at an oscillation frequency. In certain embodiments, the gain stages may be formed of transconductance gain stages which may be coupled together as a ring oscillator. Alternately, gain stages in accordance with one embodiment of the present invention may take the form of a latch type circuit. Such circuits may be used as calibration circuits in which small signal parameters of the gain stages are calibrated, and are used in turn to calibrate a target circuit.

DETAILED DESCRIPTION

In various embodiments of the present invention, a small signal gain of a calibration circuit using positive feedback may be used to directly calibrate small signal parameters of a target circuit. In so doing, more accurate calibration may occur as a direct link between calibration circuit and the target circuit may be formed. Such a calibration circuit may be used in various situations where it is desired to calibrate the gain of a target circuit. Such a calibration circuit may find application at RF and baseband. For example, in certain embodiments, such a calibration circuit may be used in situations where an open loop gain at a high bandwidth is desired, such as a LNA, a mixer, a variable gain amplifier (VGA), and the like.

In various embodiments, different circuitry may be used to calibrate a target circuit. In certain embodiments, a calibration circuit may include at least one gm-Z stage (where Z represents a general impedance block, which may be as simple as a resistor). By calibrating the value of gm-Z, a similar gm-Z in a target device may be similarly calibrated or tuned. That is, a control signal used to calibrate the gm-Z value of the calibration circuit may also be coupled to the target circuit. Similarly, a measurement or calibration of an RC (in the case that Z is formed by a parallel resistor-capacitor pair) portion of the calibration circuit may concurrently be performed to calibrate a corresponding RC portion of the target circuit for applications where accurate pole frequencies need to be set.

Figure 1A:
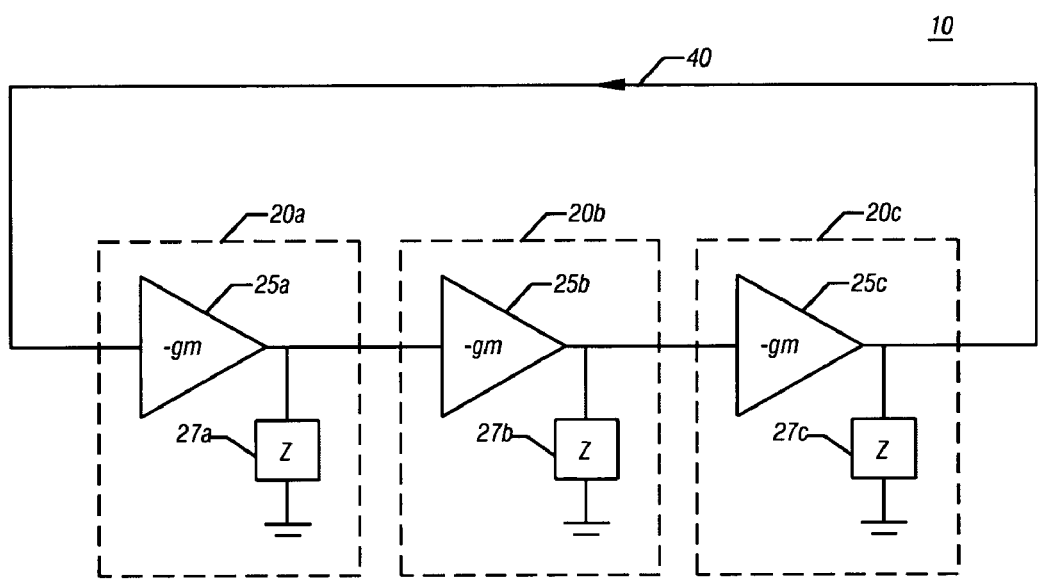
FIG. 1A is a block diagram of a calibration circuit in accordance with one embodiment of the present invention.

Referring now to FIG. 1A, shown is a block diagram of a calibration circuit in accordance with one embodiment of the present invention. As shown in FIG. 1A, calibration circuit 10 may be implemented as a ring oscillator. Such a ring oscillator may include a plurality of gain stages 20a–120c.

As shown in FIG. 1A, each gain stage may include a transconductor 25 having a transconductance value of –gm. As further shown in FIG. 1A, the output of each transconductor 25 (collectively transconductors 25a–c) may be coupled to an impedance 27 (collectively impedances 27a–c) coupled between the output of transconductor 25 and a ground potential. Further, each of the gain stages 20a–20c may be coupled together in series, and an output of the last gain stage 20c may be coupled to provide a feedback signal 40 to the input of the first gain stage 20a. While impedances 27 may take various forms, in certain embodiments, the impedances may be formed of a resistor and a capacitor (i.e., an RC circuit). In other embodiments, impedance 27 may be formed of an inductor and a capacitor (i.e., an LC circuit).

In certain embodiments, instead of a passive load an active load such as a PMOS device or an NMOS device may be coupled to each of the gain stages. Such active devices may be used to calibrate similar devices in a target circuit.

For further discussion with regard to FIG. 1A, it may be assumed that each impedance 27 may be formed of a resistor (R) and a capacitor (C) coupled in parallel between an output of transconductor 25 and a ground potential. In one such embodiment, impedance 27 may be implemented using a controlled resistive element so that a gm-Z (in the form of gm·R) may be calibrated using a variable resistance. However, in other embodiments the transconductance may be varied in order to calibrate gm·Z. While shown in the embodiment of FIG. 1A as including three gain stages, it is to be understood that in other embodiments more or fewer gain stages may be present. If fewer gain stages are present, the gain of each stage may be higher than two, while if more than three gain stages are present, the gain of each stage may be lower than two (but greater than one). In one embodiment, ring oscillator 10 may be used in connection with a broadband target circuit, such as a mixer. In such an embodiment, the gain may be greater than one at the oscillation frequencies, and the low frequency gain may be whatever is needed to allow this to happen, as shown in the below equations.

During operation, ring oscillator 10 begins to oscillate at a frequency of $\omega_0$ when feedback signal 40 becomes positive. That is, the ring oscillator begins to oscillate when each stage has a phase shift of 60° (for a total phase shift of 360°) and a gain of each stage becomes greater than two. In the embodiment shown in FIG. 1A, the transfer function of each stage is:

$$H(s) = \frac{gm \cdot R}{1 + sRC}. \quad [1]$$

Figure 2A:
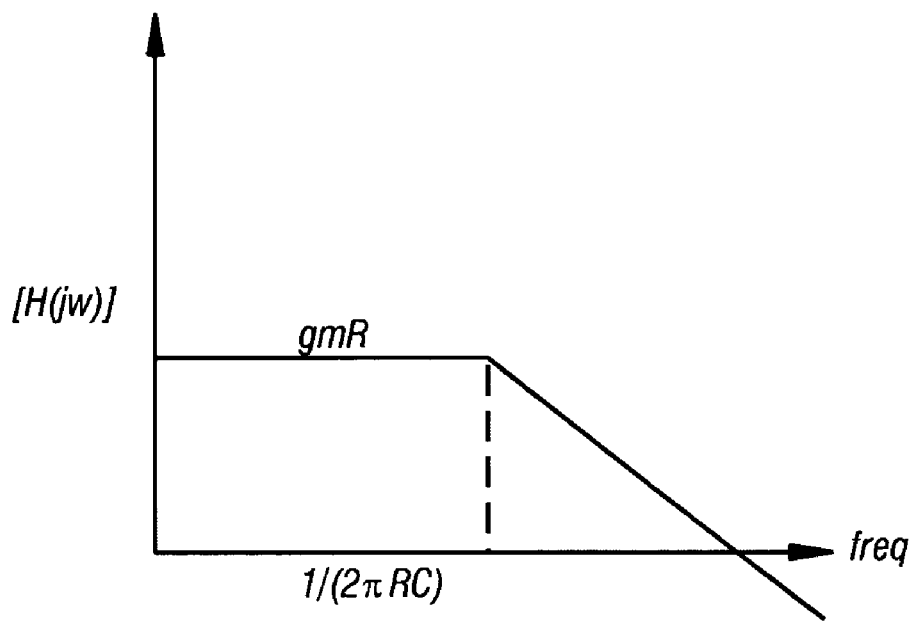
FIG. 2A is a graphical representation of a transfer function of a gain stage in accordance with an embodiment of the present invention.
Figure 2B:
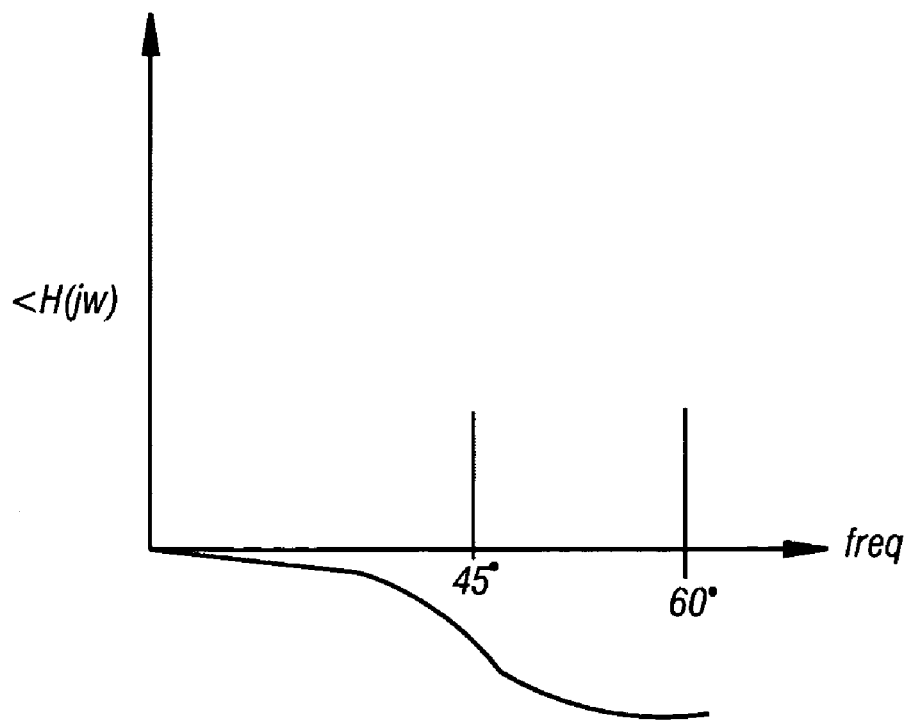
FIG. 2B is a phase response for the transfer function of FIG. 2A.

A graphical representation of the absolute value of the transfer function as a function of frequency for the circuit of FIG. 1A is shown in FIG. 2A. As shown in FIG. 2A, the absolute value crosses zero at the 60° phase shift, when oscillation begins. The phase response for the transfer function of FIG. 2A is shown in FIG. 2B. Thus oscillation occurs at $\omega_0$ and the feedback becomes positive when $\omega_0 RC = \sqrt{3}$ [2].

$$\text{Thus } \omega_0 = \frac{\sqrt{3}}{RC}. \quad [3]$$

$$\text{Accordingly, } \left| H\left(\frac{j\sqrt{3}}{RC}\right) \right| > 1. \quad [4]$$

$$\text{Therefore } \frac{gm \cdot R}{\sqrt{1 + \omega_0^2 R^2 C^2}} > 1. \quad [5]$$

$$\text{Thus } gm \cdot R > 2. \quad [6]$$

Thus during operation, the resistance of each gain stage 20a–c may be varied by a control signal such that its gm·R is greater than two. While the gain may exceed two by different amounts, any value greater than two may suffice. In practice, the closer the gain is to two, the longer it takes for the oscillation to reach full scale, and the smaller the amplitude of the oscillation is. In certain embodiments, the gain may desirably be very close to two, e.g., between approximately 2.01–2.05. Due to certain process variations and secondary considerations, in certain embodiments oscillation may occur and a positive feedback may be reached when the gain of each stage is slightly less than two. In various embodiments, it may be desirable to keep the gain relatively close to two.

In other embodiments, a calibration circuit may be used to calibrate gain for use in a tuned RF circuit. For example, a tuned RF component, such as a tuned LNA may have its gain calibrated by a calibration circuit according to an embodiment of the present invention.

Figure 1B:
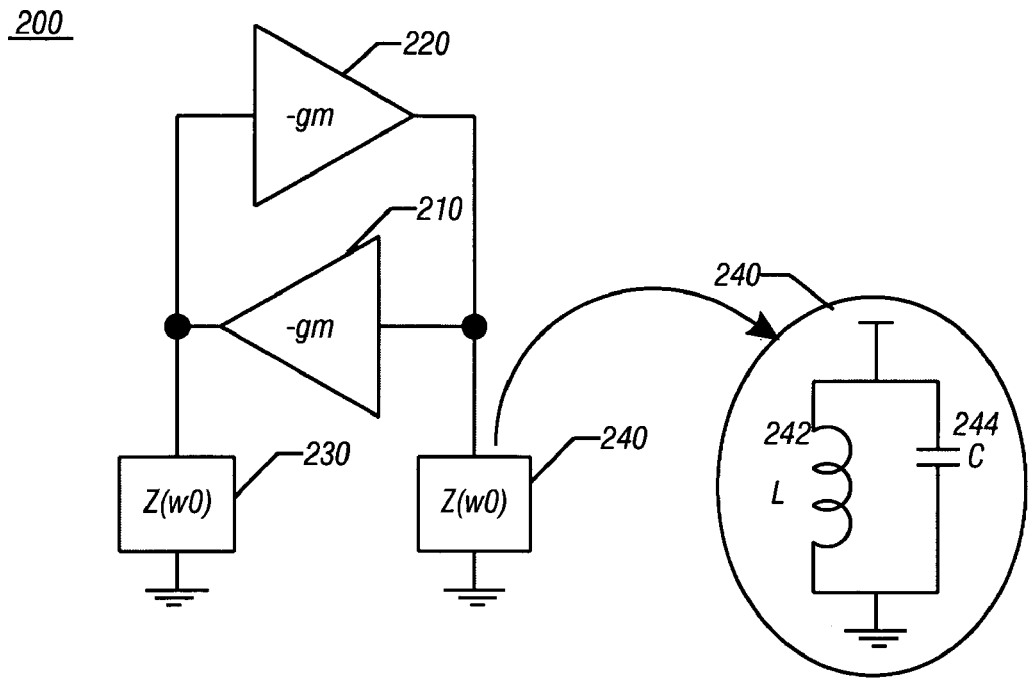
FIG. 1B is a block diagram of a calibration circuit in accordance with another embodiment of the present invention.

Referring now to FIG. 1B, shown is a block diagram of a calibration circuit in accordance with another embodiment of the present invention. As shown in FIG. 1B, ring oscillator 200 may be used to calibrate gain in a tuned RF component. As shown in FIG. 1B, ring oscillator 200 may include a first transconductor 210 having a transconductance value of –gm. The output of transconductor 210 may be coupled to an input of a second transconductor 220, which may also have a transconductance value of –gm. As shown in FIG. 1B, the output of transconductor 220 may be coupled to an input of transconductor 210. Accordingly, the outputs of each transconductor may act as a feedback signal. As further shown in FIG. 1B, a first impedance 230 may be coupled between the output of transconductor 210 and the input of transconductor 220 and a second impedance 240 may be coupled to an input of transconductor 210 in an output of transconductor 220. As further shown, impedances 230 and 240 may each be coupled to ground. While not shown in FIG. 1B, in certain embodiments, an additional impedance may be coupled between transconductors 220 and 210.

Each impedance 230 and 240 may have a generic value of $Z(\omega_0)$, where $\omega_0$ is the resonance frequency of the tuned circuit. As shown in the close-up in FIG. 1B, in one embodiment each of impedances 230 and 240 may be an LC circuit having an inductor (L) 242 and a capacitor (C) 244. In such manner, $$\omega_0 = \frac{1}{\sqrt{LC}}. \quad [7]$$

In operation, by programming the current of transconductors 210 and 220 of FIG. 1B, the gain of a tuned RF component, such as an LNA may be calibrated. Ring oscillator 200 may reach oscillation when gm·Z ($\omega_0$) is greater than one.

While in some embodiments, ring oscillator 200 may be implemented in a separate calibration circuit, in other embodiments, ring oscillator 200 may be added to circuitry already present in an RF component, such as a local oscillator, as such a circuit may already include desired impedances (e.g., LC circuits). In such manner, minimal real estate may be used, and process variations may be eliminated.

While not shown in FIGS. 1A and 1B, it is to be understood that in various embodiments, a detection circuit may be present and coupled to receive the feedback signals. Such a detection circuit may be used to detect when the ring oscillators reach a full scale of oscillation. When oscillation reaches full scale, the detection circuit may provide a signal to a control circuit (not shown in FIGS. 1A and 1B) that provides a calibration or tuning signal to the controllable elements of the ring oscillators. Such a tuning control signal may be initiated at a low value (i.e., at system power up), and be gradually increased until oscillation begins, at which point the tuning signal remains at its then current value (in embodiments in which calibration is effected on system power up). Various algorithms may be implemented in order to effect control of the controllable elements of the ring oscillators.

Figure 3A:
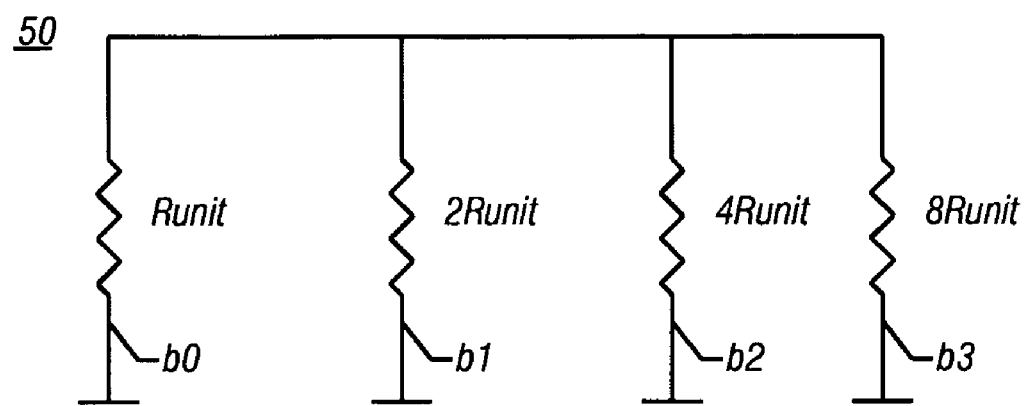
FIG. 3A is a schematic diagram of a controlled resistance in accordance with an embodiment of the present invention.

Referring now to FIG. 3A, shown is a block diagram of a controlled resistance in accordance with one embodiment of the present invention. Controlled resistance 50 of FIG. 3A may correspond to resistances within impedances 27a–c of FIG. 1A. Thus each impedance 27a–c of ring oscillator 10 of FIG. 1A may be controlled within a desired predetermined range using a controlled resistance like that of FIG. 3A. In one embodiment the switches in FIG. 3A may be implemented using transistors. Each resistance may be controlled within a wide range of values, extending between approximately 100 Ω to several MΩ. In other embodiments, the values may be between several kΩ to tens of kΩ. It is to be understood that each resistance 27a–c may be much smaller than the parasitic conductance of the gain stage.

As shown in FIG. 3A, controlled resistance 50 may be synthesized from a digitally controlled parallel connection of a plurality of fixed resistors. As shown in FIG. 3A, four fixed resistors having values of $R_{unit}$, $2R_{unit}$, $4R_{unit}$, and $8R_{unit}$, respectively, may be selectively connected or disconnected in response to a tuning control signal. In various embodiments, $R_{unit}$ may be between approximately 50 Ω and 100 kΩ. In the example shown in FIG. 3A, a four-bit digital tuning signal (i.e., including bits b0-b3) from a control circuit may be used to selectively connect or disconnect the individual resistors. Similarly, the digital tuning signal may be sent to the target circuit for calibration of associated gm-R values therein.

While shown as including four resistors in the specific embodiment of FIG. 3A, it is to be understood that in other embodiments more or fewer such resistors may be possible. It is also to be understood that there are numerous other approaches that may be used to realize a controllable resistance. For example, a programmable or otherwise programmed impedance or a voltage controlled impedance may be used. Furthermore, instead of the parallel implementation shown in FIG. 3A, a series implementation of impedances may be used. Also, instead of a digital tuning signal, other signals from a control circuit (other analog circuits, i.e., analog vs. digital control) may be used to control the controllable elements of a calibration circuit.

In other embodiments, gm·Z may be calibrated by varying gm and maintaining a fixed impedance. For example, gm may be adjusted by changing values of a bias current ($I_{bias}$) flowing therethrough.

In certain embodiments, calibration may be performed on system startup to calibrate a desired target circuit. Alternately, calibration may be performed continuously during system operation or at predetermined intervals. Such continuous calibration maybe desired when adjusting gm by varying a bias current.

After calibration of the desired components (i.e., gm or Z, or both in certain embodiments), the value of the oscillating frequency may be analyzed and used to measure the value of the impedance portion of gain stage. In such manner, the measured value of RC may be used to calibrate an impedance portion of the target circuit, for example, an RC filter coupled to the calibration circuit.

In certain embodiments, particularly with respect to a ring oscillator incorporating RC circuits such as the ring oscillator of FIG. 1A, it may be desirable for a current source to provide a constant saturation voltage (i.e., $V_{on}$) to the transconductors.

Figure 3B:
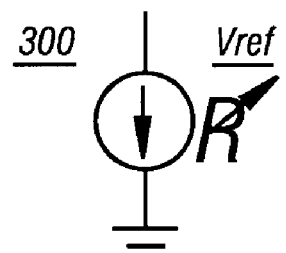
FIG. 3B is a schematic diagram of a current source in accordance with an embodiment of the present invention.

Referring now to FIG. 3B, shown is a schematic diagram of a constant current source 300 in accordance with one embodiment of the present invention. As shown in FIG. 3B, current source 300 may be formed by dividing a reference voltage (i.e., $V_{REF}$) by a controlled resistance (e.g., a variable resistance). Such controlled resistance may be the same as that shown in FIG. 3A. In such manner, the current source 300 is propagated to the transconductors so that as the current of the source is decreased, the gm of the transconductor is similarly decreased. Conversely, increasing the current increases the gain. Because there is a constant $V_{on}$, the headroom of the transconductors is constant, which provides for process independence and makes headroom issues easier to maintain and provides linearity even for corner cases.

Thus, the gain of the stage is proportional to the transconductance times the resistance. More specifically, $$gm \alpha \sqrt{I} \quad [8]$$

$$gain \alpha \sqrt{\frac{V_{ref}}{R}} \cdot R \quad [9]$$

$$gain \alpha \sqrt{R} \quad [10]$$

In such manner, by providing a current source to the transconductors, an additional bit of granularity may be effected for the controlled resistance shown in FIG. 3A. In various embodiments, a current source may be coupled to each transconductor within a calibration circuit. For example, in the embodiment of FIG. 1A, a current source may be coupled to each of transconductors 25a–c to provide a constant saturation voltage thereto. In certain embodiments, a temperature coefficient may be added to eliminate the need for continuous calibration. Because current increases with temperature, compensation for decreased gm at higher temperatures is thus provided. In such manner, a reduced variation in the constant saturation voltage may be effected. In one embodiment, the temperature coefficient may be a proportional to absolute temperature (PTAT) current, $I_{PTAT}$, which may be generated and mirrored. The two currents may then be summed and converted to a bandgap voltage with a resistor. Alternately, $I_{PTAT}$ itself may be used as the coefficient.

Figure 4:
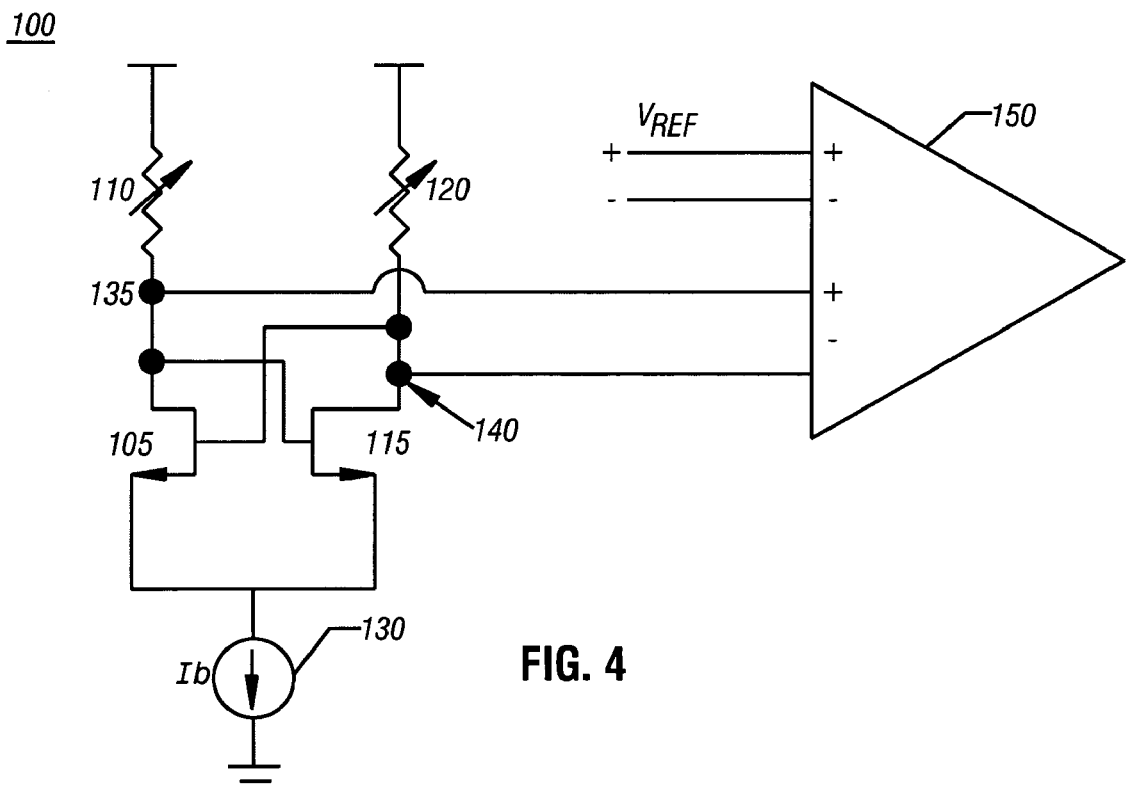
FIG. 4 is a block diagram of a calibration circuit in accordance with a third embodiment of the present invention.

In other embodiments, a latch type circuit may be used to calibrate a desired target circuit. Referring now to FIG. 4, shown is a block diagram of a calibration circuit 100 in accordance with another embodiment of the present invention. As shown in FIG. 4, calibration circuit 100 may be used to provide a calibration signal to a target circuit. Calibration circuit 100 may include a first transistor 105 and a second transistor 115 having emitters coupled to a current source 130 ($I_b$). Each of transistors 105 and 115 may be of the same size (i.e., $m_1$ of transistor 105 equals $m_2$ of transistor 115) and may have equal transconductance values (i.e., $gm_1$ of transistor 105 equals $gm_2$ of transistor 115). Transistors 105 and 115 may have bases coupled between a collector of the opposite transistor and a controlled resistance (respectively resistances 110 and 120). In such manner, nodes 135 and 140 situated between the respective collectors of transistors 105 and 115 and controlled resistances 110 and 120 may be provided as differential inputs into a comparator 150, where they may be compared to a differential reference voltage $V_{REF}$. While controlled resistors 110 and 120 may be implemented in different manners, in certain embodiments, they may be implemented with a plurality of fixed resistors as discussed above in regard to FIG. 3A.

In operation, when the absolute value of gm·R is greater than one, calibration circuit 100 may turn into a regenerative latch and any stimulus may create a large differential voltage. However, if positive feedback is achieved, one can make a −gm, and thereby create either a near zero or near infinite resistance using a calibrated resistance (or gm) such that absolute value of gm·R equals one. Thus if a noise offset of the stimulus may be accounted for, a proper threshold for the comparator may be obtained to measure gm-R=1. In certain embodiments, calibration circuit 100 may be suitable for use at frequencies around DC, such as for calibrating a baseband circuit, for example, a baseband filter.

In certain embodiments, calibration may be effected using software (or a combination of software and hardware) that may be executed on a host system, such as, for example, a computer system, receiver, a wireless device, or the like. Accordingly, such embodiments may comprise an article in the form of a machine-readable storage medium onto which there are written instructions and data that constitute a software program that defines at least an aspect of the operation of the system.

Figure 5:
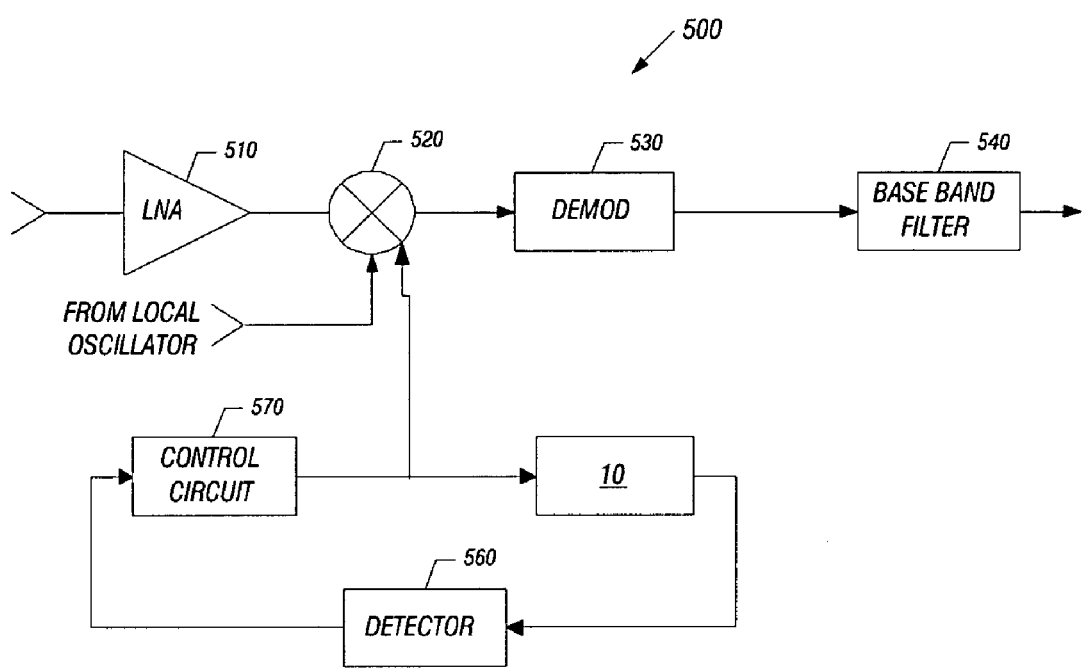
FIG. 5 is a block diagram of a system in accordance with one embodiment of the present invention.

While calibration in accordance with an embodiment of the present invention may have numerous applications, in one embodiment a calibration circuit may be used in a receiving system such as depicted in FIG. 5. The receiving system of FIG. 5 is representative in its salient aspects of receiving systems that may be used in connection with Direct Broadcast Satellite (DBS) or other such satellite communications equipment and may be included in the familiar set-top box for satellite television systems.

As illustrated in FIG. 5, receiving system 500 includes a LNA 510 that serves as front end of the receiver. LNA 510 is, in operation, coupled to an appropriate antenna (not shown). The output of LNA 510 is frequency converted in a mixer 520. As shown in FIG. 5, mixer 520 may be calibrated using a calibration circuit in accordance with an embodiment of the present invention, such as ring oscillator 10 of FIG. 1A or ring oscillator 200 of FIG. 1B, for example. The frequency-converted output of mixer 520 is demodulated by demodulator 530. In many receiver system architectures, an intermediate frequency (IF) amplifier is interposed between mixer 520 and demodulator 530. The demodulated signal is coupled to a baseband filter 540, e.g., a low-pass filter with a specified cutoff frequency.

As shown in FIG. 5, calibration circuit 10 receives control signals from control circuit 570. For example, as discussed above, a digital tuning control signal may be provided to ring oscillator 10 to control impedances 27. Similarly, as shown in FIG. 5, such a control signal may also be provided to mixer 520 to calibrate one or more associated gm·Z stages therein. As shown in FIG. 5, an output of calibration circuit 10 (which may be feedback signal 40 of FIG. 1A), may be provided as an input to a detector 560, which may be used to detect when calibration circuit 10 reaches a full stage of oscillation. When it does, detector 560 may send a signal to control circuit 570 to indicate that calibration circuit 10 has reached full stage oscillation, and to cease varying the digital tuning signal.

In various embodiments, the gm·Z of calibration circuit 10 may be substantially matched to that of a gm·Z value of mixer 520. In such manner, mixer 520 may be calibrated using the same control signals used to cause calibration circuit 10 to reach full stage oscillation. In other embodiments, such control signals may be scaled as appropriate to calibrate a target circuit as desired.

In other embodiments, a calibration circuit in accordance with an embodiment of the present invention may be used to calibrate other system components, such as a tunable baseband filter. Accordingly, baseband filter 540 may be coupled to, and be tuned by, a calibration unit in accordance with one embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a plurality of gain stages, each of the gain stages having a gain greater than one, wherein the plurality of gain stages are coupled to create a positive feedback at an oscillation frequency;
   a control circuit coupled to the plurality of gain stages, the control circuit to provide a control signal to control a controlled element of each of the plurality of gain stages; and
   a target circuit comprising a tuned radio frequency circuit coupled to receive an output of the control circuit, the plurality of gain stages forming a ring oscillator, wherein the control signal is provided to calibrate at least one transconductance stage of the target circuit.

2. An apparatus comprising:
   a calibration circuit including:
     a first transconductance stage having an input coupled to receive a positive feedback signal to calibrate a gain of the first transconductance stage, the first transconductance stage having a first transconductor coupled to a first impedance, wherein the first impedance is directly coupled to a ground potential; and
     a second transconductance stage coupled to an output of the first transconductance stage, the second transconductance stage having a second transconductance coupled to a second impedance, wherein the second impedance is directly coupled to the around potential; and
   a detection circuit coupled to receive the positive feedback signal, wherein the detection circuit is to provide a signal to a control circuit where the calibration circuit reaches a full stage of oscillation.

3. The apparatus of claim 2, further comprising a third transconductance stage coupled to an output of the second transconductance stage, the third transconductance stage having a third transconductance coupled to a third impedance.

4. The apparatus of claim 3, wherein each of the first, second and third transconductance stages have a phase shift of approximately or equal to 60°.

5. The apparatus of claim 3, wherein the first, second and third transconductance stages comprise a ring oscillator.

6. The apparatus of claim 2, wherein the first transconductor has a fixed transconductance and the first impedance comprises a variable resistance.

7. The apparatus of claim 6, where the variable resistance comprises a plurality of switch controlled resistors.

8. The apparatus of claim 2, wherein a gain of the first transconductance stage is approximately two.

9. The apparatus of claim 3, wherein an output of the third transconductance stage is coupled to provide the positive feedback signal.

10. The apparatus of claim 2, further comprising a current source coupled to provide a constant saturation voltage to the first transconductor.

11. The apparatus of claim 10, wherein the current source is formed with a reference voltage and a controlled resistance.

12. The apparatus of claim 10, further comprising a temperature coefficient to provide temperature compensation to the current source.

13. The apparatus of claim 12, wherein the temperature compensation comprises a proportional to absolute temperature current.

14. The apparatus of claim 2, wherein the apparatus is controlled by control signals from the control circuit, the control signals further coupled to calibrate a target circuit.

15. The apparatus of claim 14, wherein the target circuit comprises a mixer of a satellite receiver.

16. The apparatus of claim 1, wherein the plurality of gain stages comprise transconductance gain stages coupled as the ring oscillator.

17. The apparatus of claim 16, wherein the gain of each of the transconductance gain stages is greater than two.

18. The apparatus of claim 1, wherein the at least one transconductance stage of the target circuit is substantially matched to at least one of the plurality of gain stages.

19. The apparatus of claim 1, wherein each of the plurality of gain stages comprises a transconductance amplifier and a phase shift network coupled thereto.

20. The apparatus of claim 19, wherein the phase shift network includes a controllable element to control a value of gm·Z.

21. The apparatus of claim 19, wherein the transconductance amplifier is controllable to control a value of gm·Z.

22. The apparatus of claim 1 wherein each of the plurality of gain stages comprises a transconductance amplifier and an active load.

23. The apparatus of claim 22, wherein the active load comprises a PMOS device coupled to a ground potential.

24. The apparatus of claim 1, wherein the target circuit comprises a mixer.

25. The apparatus of claim 1, further comprising a detector circuit coupled to an output of the plurality of gain stages, wherein the detector circuit is to detect when the plurality of gain stages reaches a full scale of oscillation.

* * * * *

UNITED STATES PATENT AND TRADEMARK OFFICE
CERTIFICATE OF CORRECTION

PATENT NO.       : 7,218,179 B2
APPLICATION NO.  : 10/854980
DATED            : May 15, 2007
INVENTOR(S)      : Philip Crawley It is certified that error appears in the above-identified patent and that said Letters Patent is hereby corrected as shown below:

<u>Column 8</u>:
Line 40, "around" should be --ground--.

Signed and Sealed this

Twenty-fourth Day of July, 2007

JON W. DUDAS
*Director of the United States Patent and Trademark Office*